United States Patent
Minami et al.

(10) Patent No.: US 8,800,589 B2
(45) Date of Patent: Aug. 12, 2014

(54) MATERIAL GAS CONCENTRATION CONTROL SYSTEM

(75) Inventors: Masakazu Minami, Cupertino, CA (US); Masaki Inoue, Cupertino, CA (US)

(73) Assignees: Horiba, Ltd., Kyoto-shi (JP); Horiba Stec, Co., Ltd., Kyoto-shi (JP)

(*) Notice: Subject to any disclaimer, the term of this patent is extended or adjusted under 35 U.S.C. 154(b) by 688 days.

(21) Appl. No.: 12/609,965

(22) Filed: Oct. 30, 2009

(65) Prior Publication Data

US 2010/0108153 A1     May 6, 2010

(30) Foreign Application Priority Data

Oct. 31, 2008 (JP) ................................ 2008-282623

(51) Int. Cl.
*C23C 16/448* (2006.01)
*G05D 11/13* (2006.01)
*C30B 25/14* (2006.01)

(52) U.S. Cl.
CPC .......... *G05D 11/139* (2013.01); *C23C 16/4482* (2013.01); *C30B 25/14* (2013.01)
USPC ....................................................... 137/93

(58) Field of Classification Search
CPC .... C23C 16/4482; C30B 25/14; G05D 11/08; G05D 16/2013
USPC .............. 137/14, 88, 93, 87.05, 87.06, 487.5; 156/345.29; 118/688–692, 715; 261/65, 119.1
See application file for complete search history.

(56) References Cited

U.S. PATENT DOCUMENTS 4,517,220 A * 5/1985 Rose .............................. 118/715

7,353,841 B2 * 4/2008 Kono et al. .................... 118/715
8,047,510 B2 * 11/2011 Hirata et al. ..................... 261/65
2007/0254093 A1    11/2007 Nijhawan et al.

FOREIGN PATENT DOCUMENTS

| JP | 08227836 A | 9/1996 |
|---|---|---|
| JP | 09047697 A | 2/1997 |
| JP | 09063965 A | 3/1997 |
| JP | 2000170955 A | 6/2000 |
| JP | 2000306839 A | 11/2000 |
| JP | 2001235099 A | 8/2001 |
| JP | 2003-257871 | 9/2003 |
| WO | WO 2008001483 A1 * | 1/2008 |

OTHER PUBLICATIONS

Japanese Patent Office, Office Action of Japanese Patent Application No. 2013-020788, Mar. 20, 2014, 4 pages.

* cited by examiner

*Primary Examiner* — Eric Keasel
(74) *Attorney, Agent, or Firm* — Alleman Hall McCoy Russell & Tuttle LLP (57) ABSTRACT

An object of this invention is to provide a responsive material gas concentration control system that can be mounted on a bubbling system and that can control a concentration of a material gas in a mixed gas at a constant value even though a partial pressure of the material gas fluctuates. The material gas concentration control system is used for a material evaporation system, and comprises a body that is connected to an outlet line and that has an internal flow channel for flowing the mixed gas, a concentration measuring part that measures the concentration of the material gas in the mixed gas, and a first valve that is arranged downstream of the concentration measuring part and that adjusts the measured concentration measured by the concentration measuring part at a previously determined set concentration, wherein the concentration measuring part and the first valve are mounted on the body.

11 Claims, 5 Drawing Sheets

MATERIAL GAS CONCENTRATION CONTROL SYSTEM

FIELD OF THE ART

This invention relates to a system for controlling a concentration of a material gas that introduces a carrier gas into a solid or liquid material accommodated in a tank and that controls a concentration of the evaporated material gas in a material evaporation system for evaporating the material.

BACKGROUND APT

A representative material gas concentration control system for this kind of material evaporation system is a material gas concentration control system comprising a mass flow controller arranged in an inlet line that introduces a carrier gas, a constant temperature bath to keep a tank where a material liquid is stored at a constant temperature, and a pressure sensor that is arranged in an outlet line to output a mixed gas comprising a material gas and the carrier gas and that measures a pressure, namely a total pressure, of the mixed gas.

This material gas concentration control system evaporates the material liquid constantly at a saturated vapor pressure with a temperature of the material liquid kept constant so as to make a partial pressure of the material gas at a constant temperature and to control the flow of the carrier gas so as to make the total pressure measured by the pressure sensor at a constant temperature by the use of the mass flow controller. With this arrangement, since the concentration of a vapor component is expressed by the partial pressure of the vapor component divided by the total pressure of the system, the concentration of the vapor component, namely, the concentration of the material gas, is also considered to be constant because the partial pressure and the total pressure are constant.

However, even though the tank is kept at a constant temperature by the use of a constant temperature bath, since the saturated vapor pressure changes due to the drop of the temperature because of the heat of vaporization at a time of vaporizing the material liquid, and the partial pressure of the material gas also changes, the concentration of the material gas deviates from the desired concentration. In addition, when the amount of the material liquid changes, a contact period during which the carrier gas contacts the material liquid or a state of the carrier gas contacting the material liquid by means of bubbling changes, so that the material gas fails to achieve vapor-liquid equilibrium and saturate the vapor gas. As a result, the partial pressure of the material gas changes so that the concentration of the material gas deviates from the desired concentration.

Furthermore, even though the material liquid is vaporized at the saturated vapor pressure on a constant basis, in a case of trying to change the concentration of the material gas, it is necessary to change the saturated vapor pressure by changing the temperature in the tank. Since it usually takes a long time to change the temperature in the tank, the responsiveness of controlling the concentration of the material gas becomes poor.

As mentioned, in order to control the concentration of the material gas, since it is necessary to arrange a component in both the inlet line and the outlet line, a component mounting man-hour increases or component mounting becomes troublesome.

Patent document 1: U.S. Published Patent Application No. 2007/0254093

2

Patent document 2: Japanese Laid-Open Patent Publication No. 2003-257871

DISCLOSURE OF THE INVENTION

Problems to be Solved by the Invention

The present claimed invention intends to solve the above-described problems. In the first place this invention is not based on the premise that the partial pressure of the material gas is kept constant by keeping the temperature of the tank constant. An object of this invention is to provide a highly responsive material gas concentration control system that can be easily mounted on a bubbling system and that can control to keep a concentration of a material gas in a mixed gas constant even though a partial pressure of the material gas fluctuates in the bubbling system.

Means to Solve the Problems

More specifically, the material gas concentration control system in accordance with this invention is used for a material evaporation system comprising a tank to accommodate a material, an inlet line to input a carrier gas for evaporating the accommodated material into the tank and an outlet line to output a mixed gas consisting of a material gas formed of the evaporated material and the carrier gas from the tank, and is characterized by comprising a body that is connected to the outlet line and that has an internal flow channel for flowing the mixed gas, a concentration measuring part that measures the concentration of the material gas in the mixed gas flowing in the internal flow channel, and a first valve that is arranged downstream of the concentration measuring part and that adjusts the measured concentration measured by the concentration measuring part to a previously determined set concentration, wherein the concentration measuring part and the first valve are mounted on the body.

With this arrangement, since the concentration of the material gas itself in the mixed gas is measured by the concentration control part and the measured concentration can be adjusted at the previously determined set concentration by the first valve, even though the generated amount of the material gas fluctuates in the case that the material liquid fails to achieve vapor-liquid equilibrium because of a low evaporation rate or a change in a state of bubbling, it is possible to keep the concentration at a constant value irrespective of the evaporation fluctuation.

In other words, it is possible to keep the concentration of the mixed gas constant without keeping the generated material gas at a constant amount by controlling the temperature in the tank.

In addition, with this arrangement, the concentration of the material gas in the mixed gas is adjusted by the first valve. Since it is not required to wait for the temperature to change, it is possible to achieve good responsive control of the concentration of the material gas, with a smaller time delay as compared with a case where the amount of the material gas is controlled by controlling the temperature in the tank.

Furthermore, since the first valve is arranged downstream of the concentration measuring part, it is possible for the concentration measuring part to accurately measure the concentration, i.e., the concentration in the tank, prior to being affected by the adjustment by the first valve. As a result, since it is possible to know how to operate the first valve accurately in order to adjust the concentration to the previously determined set concentration, it is also possible to control the concentration of the material gas with accuracy.

In addition, since the material gas concentration control system is of one unit, wherein the concentration measuring part and the first valve are mounted on the body, it is possible to control the concentration of the material gas easily just by connecting the internal flow channel so as to be a part or all of the outlet line of the bubbling system. Conventionally, in order to control the concentration, since a wiring procedure for feeding back the measured concentration to the inlet line is necessary, installation is troublesome. However, with this arrangement, since this procedure is not necessary, it is possible to considerably reduce a number of processes to install this system.

Furthermore, in the case that the concentration measuring part consists of multiple measuring components, since the material gas concentration control system is of one unit, it is possible to make each position of the measuring component closer so that the measurement can be conducted at generally the same measuring position compared with a case that multiple measuring components are individually mounted on the outlet line. As a result, it is possible to measure the concentration accurately so that the concentration of the material gas can be controlled with high accuracy.

Furthermore, since the measuring components are packed in one unit, there is no need of adjusting the temperature of the measuring component respectively in case of, for example, keeping the measurement accuracy by adjusting the temperature. As a result, it is possible to reduce a number of the heaters to be installed or to make the heaters as one unit, thereby reducing cost.

In addition, since the material gas concentration control system is of one unit, it is possible to arrange this system at a position close to a downstream process while preserving accuracy. As mentioned, in accordance with the material gas concentration control system of this invention, once controlled, concentration is not easily changed so that it is easy to supply the material gas to the downstream process while keeping a necessary accuracy of the concentration of the material gas.

As a concrete embodiment of a representative concentration measuring part that makes it possible to measure the concentration of the material gas with a simple configuration, is a concentration measuring part that comprises a partial pressure measuring part that measures a partial pressure of the material gas, and a pressure measuring part that measures a pressure of the mixed gas, wherein the concentration of the material gas in the mixed gas is measured based on the measured partial pressure measured by the partial pressure measuring part and the measured pressure measured by the pressure measuring part.

Depending on a component of the material gas, there is a case that an adverse effect is exerted on controlling the concentration of the material gas because some component clings to a tube wall of the flow channel so that a channel resistance becomes big or a diameter of the channel becomes small and the flow rate fluctuates. In order to prevent this problem it is preferable that a surface of the internal flow channel is provided with a mirror finished process so as to prevent a condensed state of the material gas from attaching to the surface of the internal flow channel. For some concentration measuring parts, there is a case that a measurement error occurs due to the temperature change of the mixed gas flowing in the internal flow channel. In order to lessen the measurement error so as to improve the accuracy in controlling the material gas concentration, a temperature measuring part for measuring a temperature of the mixed gas flowing in the internal flow channel is further provided. With this arrangement, it is possible to compensate the measured value by the use of a correction curve according to the measured temperature.

Effect of the Invention

In accordance with the material gas concentration control system of this invention, since the concentration of the material gas in the mixed gas is measured by the concentration measuring part and the measured concentration is adjusted so as to be at the desired value by the first valve, even though the amount of the material gas evaporated from the material liquid in the tank fluctuates, it is possible to control the concentration irrespective of the fluctuation. In addition, in a case of changing the concentration, since the concentration is controlled by changing the amount of the material gas not by means of the temperature change that takes time but by the use of the first valve, the concentration can be controlled with high responsiveness.

BEST MODES OF EMBODYING THE INVENTION EMBODIMENT

One embodiment of this invention will be explained with reference to drawings.

A material gas concentration control system 2 in accordance with this invention is used for, for example, providing a stable isopropyl alcohol (IPA) concentration in a dry processing tank of a wafer cleaning unit used for a semiconductor manufacturing process. More specifically, this system 2 is used for a bubbling system 1 that provides an evaporated IPA material liquid L into the dry processing tank. The IPA material liquid L corresponds to the material in the claims and the bubbling system 1 corresponds to the material evaporation system in the claims. If the material is a solid, this invention produces the same effects. In addition, this invention is not limited to controlling of the concentration of the evaporated IPA material liquid L. This invention can also be used for controlling the concentration in, for example, a chemical vapor deposition (CVD) film deposition system or a metal-organic chemical vapor deposition (MOCVD) film deposition system.

Figure 1:
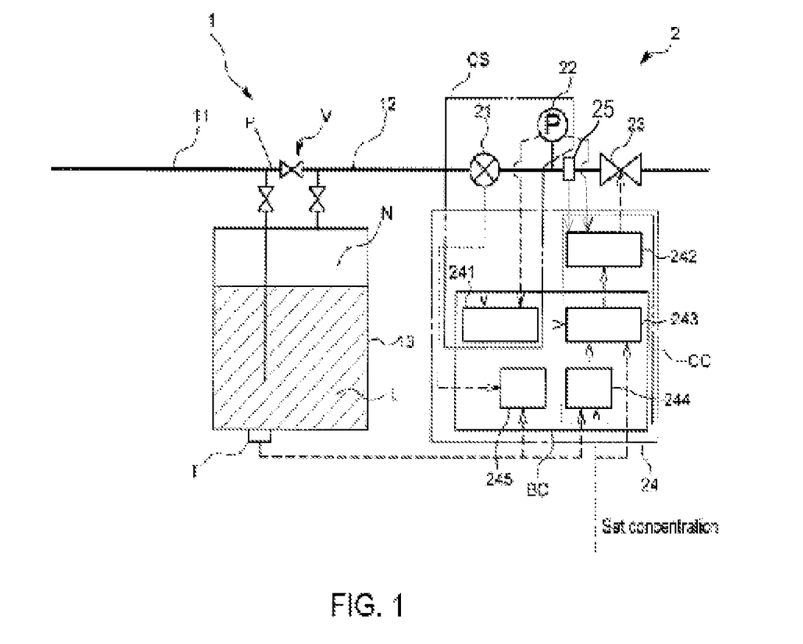
FIG. 1 is a schematic diagram illustrating a material gas concentration control system in accordance with one embodiment of this invention.

As shown in FIG. 1, the bubbling system 1 comprises a tank 13 to store the material liquid L, an inlet line 11 to input a carrier gas into the liquid material L stored in the tank 13 so as to cause bubbling and an outlet line 12 to output a mixed gas consisting of a material gas comprising the evaporated material liquid L and the carrier gas from a space N above the material liquid L stored in the tank 13. Furthermore, a purge line P that connects the inlet line 11 and the outlet line 12 is arranged outside of the tank 13. An open/close valve V is arranged in the purge line P and the open/close valve V is closed at a-normal time while the material gas is vaporized and the concentration of the material gas is controlled. At a time of zero point adjustment of the concentration measuring part CS, to be described later, the open/close valve V is open so as not to pass the carrier gas in the tank 13.

Furthermore, this bubbling system 1 is provided with a temperature sensor T arranged in the tank 13 for measuring the temperature of the inside of the tank 13, and with the material gas concentration control system 2 arranged in the inlet line 12.

Figure 2:
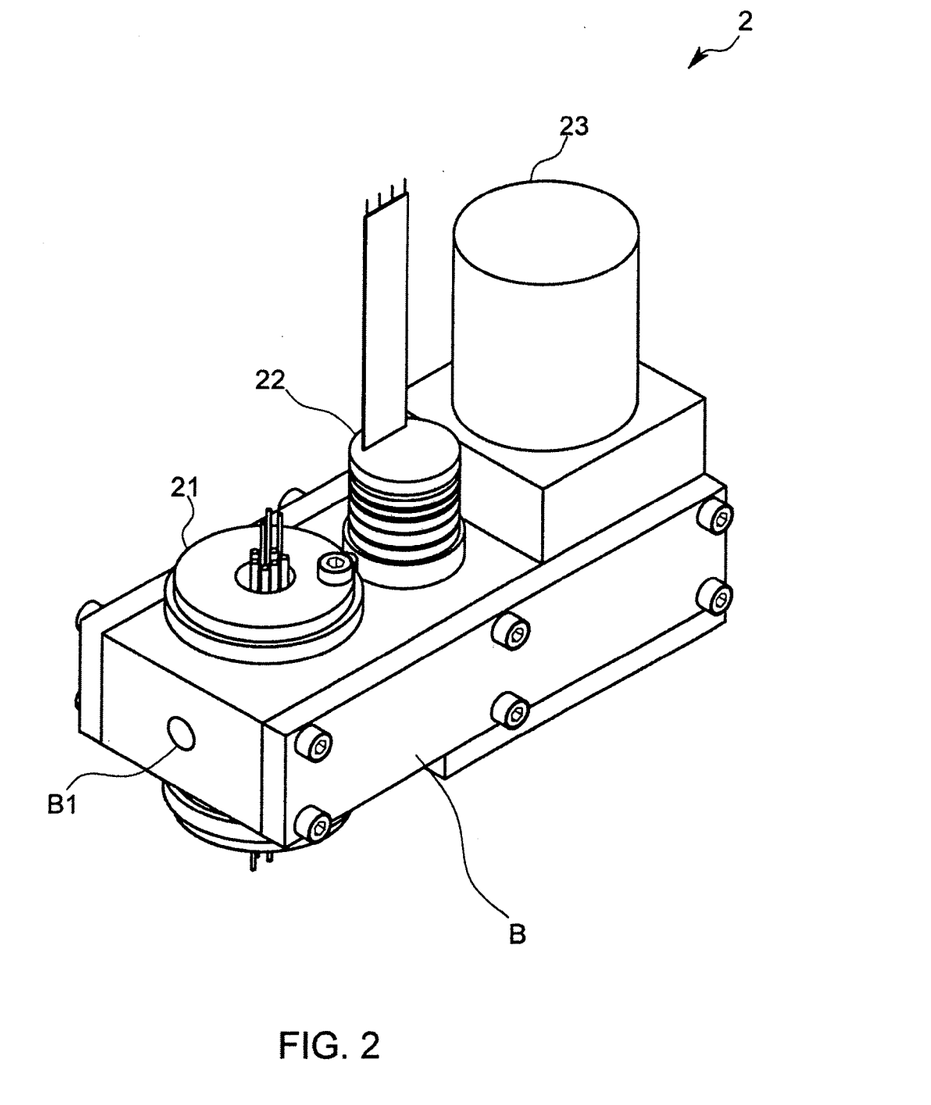
FIG. 2 is a perspective view of the material gas concentration control system in accordance with an embodiment of this invention.
Figure 3:
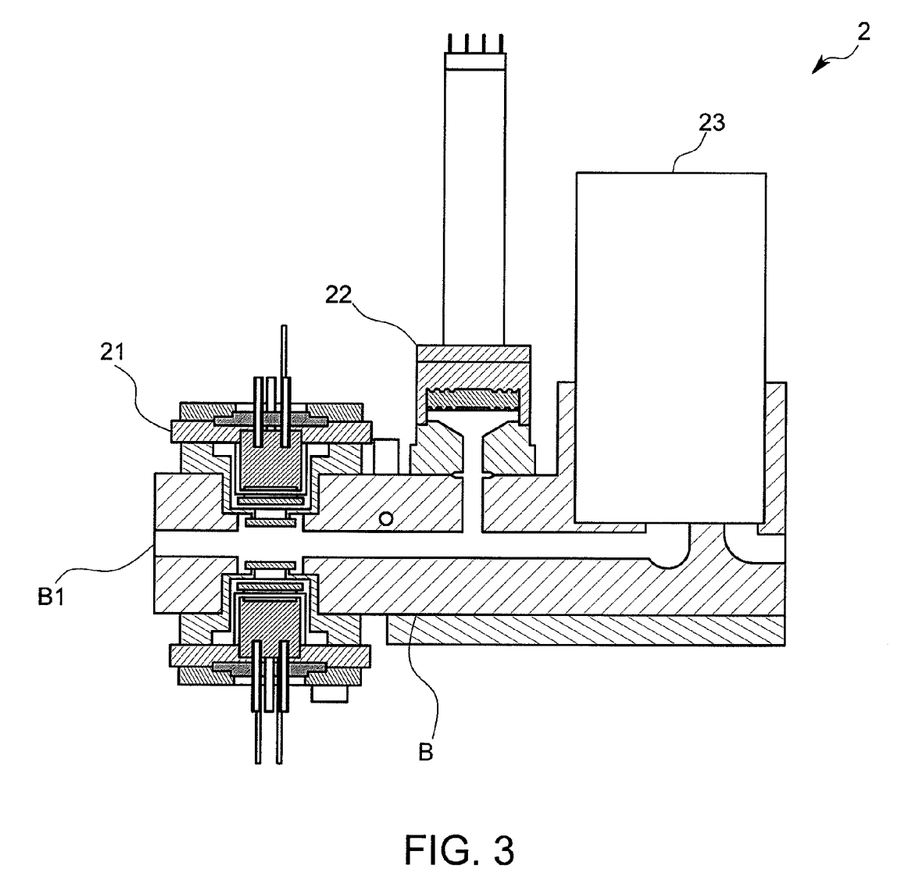
FIG. 3 is a schematic sectional view of the material gas concentration control system in accordance with the embodiment of FIG. 2.

Next, the material gas concentration control system 2 will be described in detail with reference to FIG. 1, FIG. 2 and FIG. 3.

A configuration of hardware of the material gas concentration control system 2 will be explained. The material gas concentration control system 2 comprises, as shown in the perspective view of FIG. 2 and the cross-sectional view of FIG. 3, a body B generally in a shape of a cuboid having an internal flow channel B1 that is connected with the outlet line 12 of the bubbling system 1 and that constitutes a part of the bubbling system 1, a partial pressure measuring sensor 21 which forms a partial pressure measuring part to measure the partial pressure of the material gas in the mixed gas, a pressure sensor 22 which forms a pressure measuring part to measure the pressure (total pressure) of the mixed gas flowing in the internal flow channel B1, and a first valve 23 to adjust the pressure of the mixed gas by means of an open degree of the valve body (valve position), where each of the partial pressure measuring sensor 21, the pressure sensor 22 and the first valve 23 is arranged in the body B in this order from upstream. As shown in a pattern diagram of FIG. 1, the material gas concentration control system 2 further comprises a control part 24 to control the first valve 23.

In order to control the concentration of the material gas in the mixed gas, it is necessary to arrange the partial pressure measuring sensor 21 and the pressure sensor 22 upstream of the first valve 23. This is intended to make it possible to control the concentration according to a change of the evaporated state of the material liquid by measuring the total pressure in the tank 13 and the concentration of the materiel gas in the mixed gas prior to being affected by the first valve 23.

The partial pressure measuring sensor 21, the pressure sensor 22 and the concentration calculating part 241, to be described later, correspond to the concentration measuring part CS in claims.

The internal flow channel B1 of the body B is formed by a generally cylindrical through-bore. The inner surface of the internal flow channel B1 is provided with a mirror finishing process so as to prevent condensed phases of the material gas from adsorbing to the inner surface. With this arrangement, it is possible to prevent a case of failing to obtain an assumed flow or to prevent a harmful effect on the measurement accuracy or on the accuracy of the concentration control due to a narrowed internal flow channel B1 because of the material gas. In addition, it is preferable that the mirror finishing process is provided also to portions of the partial pressure measuring sensor 21 and of the pressure sensor 22 that contact the material gas. Furthermore, it is conceivable that a material of the body B is stainless steel; however, in the case that a corrosive gas such as a hydrogen fluoride gas is used as the mixed gas, it is preferable that a corrosion resistant resin such as TEFLON (registered trademark) is used for the internal flow channel B1.

The measurement method used by the partial pressure measuring sensor 21 is of the non-dispersive infrared (NDIR) method. Partial pressure measuring sensor 21 is mounted on the body B in a state of radially surrounding the internal flow channel B1. The partial pressure measuring sensor 21 comprises a light source part arranged at a lower part in a cross-sectional view of the FIG. 3 and an optical receiving part arranged at an upper part in the cross-sectional view so as to measure the partial pressure of the material gas passing between the light source part and the optical receiving part.

The pressure sensor 22 is mounted on the body B at a position separated downstream from the area where the partial pressure measuring sensor 21 conducts measurement by a predetermined distance so as to conduct the measurement at a position radially upward of the internal flow channel B1. The pressure sensor 22 measures the pressure in the tank 13 by measuring the pressure of the mixed gas flowing in the internal flow channel B1. In this specification, a concept of the pressure in the tank includes the pressure in the tank itself and the pressure in the outlet line 12 locating upstream of the first valve 23.

The first valve 23 is mounted on the body B separated downstream from the pressure sensor 22 by a predetermined distance. An open degree of the first valve 23 is controlled by a concentration control part CC, to be described later, so as to control the concentration of the material gas.

In addition, a heater (not shown in drawings) is arranged on the body B to extend in parallel with the internal flow channel B1. The heater is used to adjust and to keep the temperature of the partial pressure measuring sensor 21 and the pressure sensor 22 at a predetermined temperature. With this arrangement, it is possible to avoid an influence on the partial pressure measuring sensor 21 and the pressure sensor 22 from the ambient temperature change of the material gas concentration control system 2 or the temperature change due to the mixed gas flowing in the internal flow channel B1. Furthermore, it is possible to prevent the material in the mixed gas from adsorbing to a window of the partial pressure measuring sensor 21 for transmitting the light to the internal flow channel B1 or to prevent dew condensation on the window. Especially, since the partial pressure measuring sensor 21 is sensitive to a phenomenon resulting from the temperature change, the temperature of a partial pressure measuring sensor alone may be adjusted.

Figure 4:
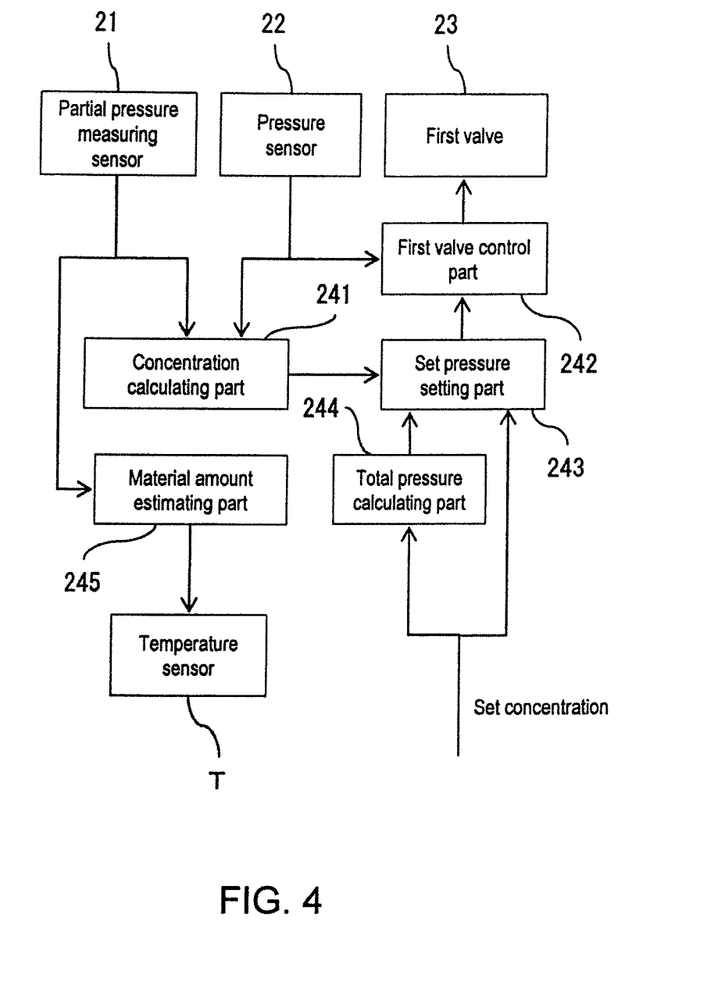
FIG. 4 is a function block diagram in accordance with the embodiment of FIG. 2.

Next, the control part 24 including software of the material gas concentration control system 2 will be explained based on the schematic diagram in FIG. 1 and the function block diagram in FIG. 4.

The control part 24 makes use of a computer and comprises an internal bus, a CPU, a memory, an I/O channel, an A/D converter and a D/A converter or the like. The functions of the first valve control part 242, the concentration calculating part 241, the set pressure setting part 243, the total pressure calculating part 244 and the material liquid amount estimating part 245 can be produced by operating the CPU and its peripheral devices according to predetermined programs previously stored in the memory. The first valve control part 242 alone is composed of a control circuit such as an independent one-chip microcomputer so as to receive the set pressure and the pressure can be easily controlled just by inputting the set pressure. With this arrangement, since it is possible to use the control circuit or the software that has been conventionally developed for controlling the pressure in order to control the concentration, increase of a cost for designing or developing the control part can be prevented.

The first valve control part 242, the set pressure setting part 243 and the total pressure calculating part 244 cooperatively produce a function as the concentration control part CC described in claims.

Each component will be described.

The concentration calculating part 241 calculates the concentration of the material gas in the mixed gas based on the partial pressure of the material gas measured by the partial pressure measuring sensor 21 and the total pressure, which is a measured pressure measured by the pressure sensor 22. The concentration of the material gas in the mixed gas can be calculated by the partial pressure/the total pressure obtained by the equation of state of gas.

The first valve control part 242 controls an open degree of the first valve 23 so as to make the pressure (the total pressure) measured by the pressure sensor 22 become a set pressure, which is a pressure set by the set pressure setting part 243.

The set pressure setting part 243 sets the set pressure as a temporary set pressure which is the pressure in the tank 13 calculated by the total pressure calculating part 244, to be described later, during a predetermined period after the set concentration is changed, and changes the previously determined set pressure so as to lessen a deviation between the measured concentration measured by the concentration measuring part CS and the set concentration during other period.

More concretely, during a predetermined period after the set concentration is changed, a state wherein the temporary set pressure calculated by the total pressure calculating part 244 is set as the set pressure, is kept without changing the set pressure for the first valve control part 242 even though the partial pressure of the material gas to be measured or the total pressure of the mixed gas fluctuates. The predetermined period is a time required for the measured concentration to reach a desired concentration or a time required for fully reducing the deviation, and it may be obtained on an experimental basis or may be set arbitrarily.

During the other period after the predetermined period, namely, during an ordinary operating period, the set pressure setting part 243 changes the set pressure so as to lessen the deviation between the measured concentration and the set concentration for the first valve control part 242 according to the fluctuation of the partial pressure of the measured material gas or the total pressure of the mixed gas. Specifically, in the case that the measured concentration is higher than the set concentration, it is possible to lower the concentration by increasing the total pressure because the concentration is obtained by the dividing the partial pressure by the total pressure. Accordingly, in the case that the measured concentration is higher than the set concentration, the set pressure setting part 243 changes the set pressure so as to increase the total pressure for the first valve control part 242. As a result, the first valve control part 242 controls the open degree of the first valve 23 to be small. In the case that the measured concentration is lower than the set concentration, a reverse procedure is conducted.

As mentioned, to change the set pressure so as to lessen the deviation between the measured concentration and the set concentration means that the set pressure is changed to be higher in the case that the measured concentration is higher than the set concentration, while the set pressure is changed to be lower in the case that the measured concentration is lower than the set concentration.

The total pressure calculating part 244 calculates a pressure in the tank in order to make the concentration of the material gas become at the set concentration at a measured temperature measured by the temperature sensor T and sets the pressure as the temporary set pressure. The calculated pressure in the tank 13 is transmitted to the set pressure setting part 243 and the calculated pressure is used as the set pressure set for the first valve control part 242 by the set pressure setting part 243 at a time of starting up or during the predetermined period after the set concentration is changed.

Calculation of the pressure in the tank 13 by the total pressure calculating part 244 will be explained in detail. Based on a temperature in the tank 13, the total pressure calculating part 244 calculates a saturated vapor pressure of the material gas at the temperature. Then the total pressure calculating part 244 calculates the pressure, namely the total pressure in the tank 13 to make the concentration of the material gas become at the newly set concentration in case that the saturated vapor pressure is the partial pressure. Since the concentration is expressed by the partial pressure divided by the total pressure, the pressure in the tank 13 can be obtained by dividing the saturated vapor pressure of the material gas at the measured temperature by the newly set concentration.

The material liquid amount estimating part 245 calculates the saturated vapor pressure of the material gas in the tank 13 at the temperature measured by the temperature sensor T, and estimates the amount of the material liquid L in the tank 13 by comparing the saturated vapor pressure with the measured partial pressure of the material gas measured by the partial pressure measuring sensor 21. More concretely, if the amount of the material liquid L decreases, the material liquid L fails to achieve vapor-liquid equilibrium because the contact time period when bubbles of the carrier gas contact the material liquid L is shortened. As a result, the partial pressure of the material gas becomes small compared with the saturated vapor pressure. In the case that, for example, a ratio of the partial pressure of the measured material gas to the saturated vapor pressure is smaller than a predetermined value, the material liquid amount estimating part 245 estimates that a stored amount of the material liquid L is less than a specified stored amount of the material liquid L. Then if the material liquid amount estimating part 245 estimates that the stored amount of the material liquid L is low, this state is displayed so as to urge the material liquid L be supplied.

The material gas concentration control system 2 controls the concentration of the material gas in the mixed gas by itself wherein each component is configured as one unit by making use of the hardware and the software.

Figure 5:
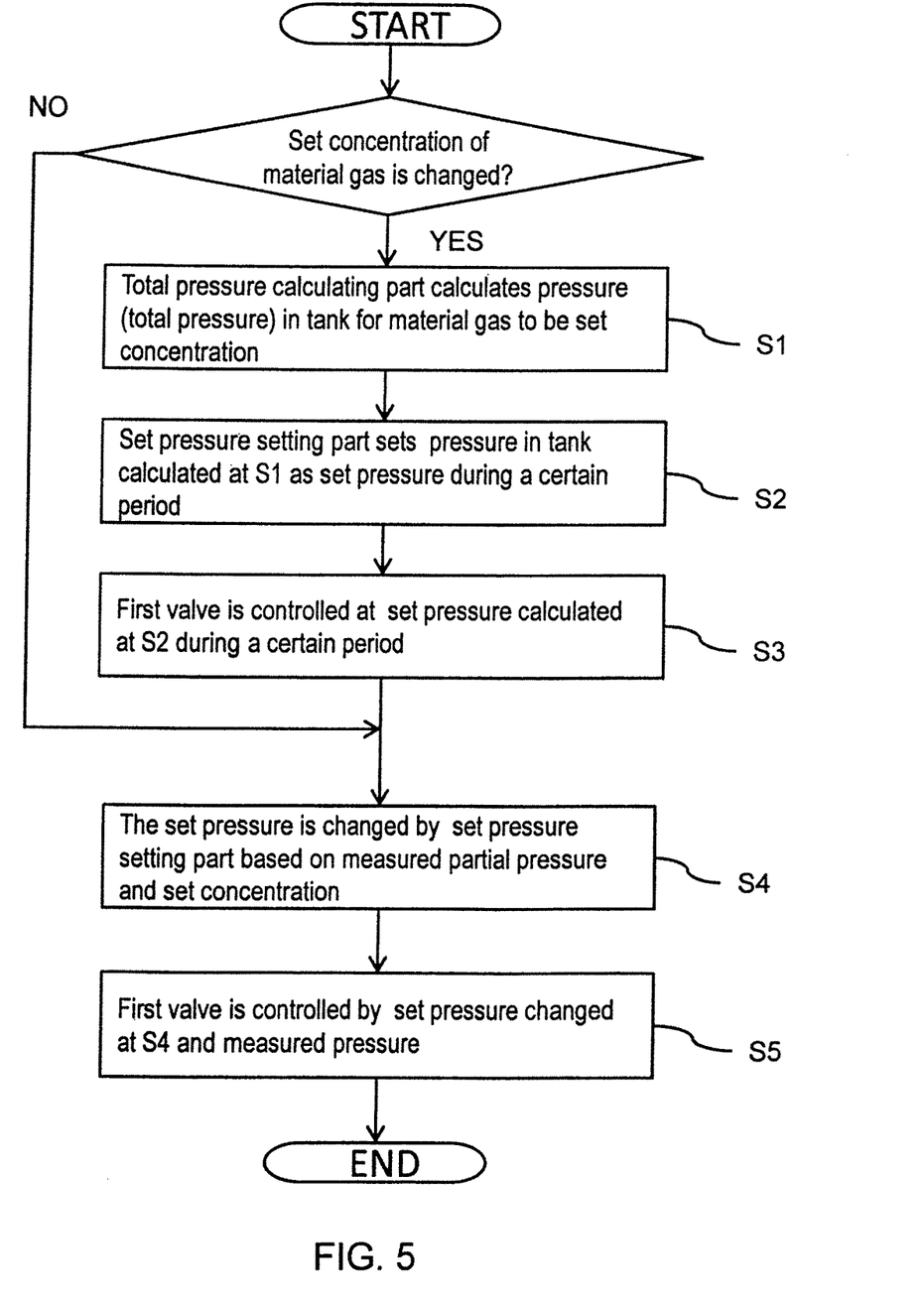
FIG. 5 is a flow chart showing an embodiment of a method of operation for controlling a material gas concentration in accordance with this invention.

Next, an operation of controlling the concentration of the material gas in the mixed gas will be explained with reference to the flow chart in FIG. 5.

The concentration calculating part 241 calculates the concentration of the material gas in the mixed gas by the expression (1) by the use of the partial pressure of the material gas measured by the partial pressure measuring sensor 21 and the total pressure of the mixed gas measured by the pressure sensor 22.

$$C=P_z/P_t \qquad (1)$$

Wherein, C is the concentration, $P_z$ is the partial pressure of the material gas, and $P_t$ is the total pressure of the mixed gas.

At a time of starting up when the set concentration is first set or a time when the set concentration is changed, the total pressure calculating part 244 first calculates the saturated vapor pressure of the material gas based on the temperature measured by the temperature sensor T. In the case that the partial pressure of the material gas is the calculated saturated vapor pressure, the pressure in the tank 13, namely, the total pressure $P_{ts}$, (the temporary set pressure) of the mixed gas so as to be the set concentration is calculated by the expression (1) by the use of the set concentration and the calculated partial pressure (step S1).

The set pressure setting part 243 sets the total pressure $P_{ts}$ (the temporary set pressure) as the set pressure for the first valve control part 242 and does not change the set pressure during a predetermined period after the set concentration is changed even though the partial pressure of the material gas fluctuates (step S2). The first valve control part 242 controls the open degree of the first valve 23 by means of the set pressure $P_{ts}$ during the predetermined period, resulting in controlling the concentration measured by the concentration measuring part CS to be the set concentration or a value close to the set concentration (step S3).

At a time of an ordinary operation after passing the predetermined period from a time of changing the set concentration, in the case that the concentration measured by the concentration measuring part CS is different from the set concentration set by the set pressure setting part 243, the set pressure setting part 243 changes the set pressure $P_{t0}$ as follows based on the partial pressure $P_z$ of the material gas measured by the partial pressure measuring sensor 21 and the set concentration $C_0$ by the expression (2) (step S4).

$$P_{t0}=P_z/C_0 \qquad (2)$$

Wherein, $P_z$ is a value constantly measured by the partial pressure measuring sensor 21, and $C_0$ is a known value because it is a set concentration.

At a time when the set pressure is changed to $P_{t0}$, the first valve control part 242 controls the open degree of the first valve 23 so as to lessen the deviation between the pressure (the total pressure) $P_t$ measured by the pressure sensor 22 and the set pressure $P_{t0}$ (step S5).

The finally measured concentration of the material gas in the mixed gas becomes the set concentration $C_0$ if the partial pressure $P_z$ of the material gas does not fluctuate while the measured pressure $P_t$ follows the set pressure $P_{t0}$.

In the case that the partial pressure $P_z$ of the material gas fluctuates while the measured pressure $P_t$ follows the set pressure $P_{t0}$, the set pressure setting part 243 changes the set pressure $P_{t0}$ again by the expression (2) so as to be the set concentration $C_0$.

As mentioned, it is possible for the material gas concentration control system 2 to keep the measured concentration stably at a predetermined set concentration even though the evaporated state of the material gas changes so that the partial pressure fluctuates.

With the material gas concentration control system 2 in accordance with this embodiment, since the concentration is controlled not with the poorly responsive partial pressure or the concentration containing the poorly responsive partial pressure set as the direct control variable, but with the total pressure that can be easily controlled by the first valve 23 set as the control variable, it is possible to control the concentration of the material gas with high accuracy and high responsiveness even though the evaporation rate of the material gas is low or the evaporation rate of the material gas fluctuates.

In addition, since the material gas concentration control system 2 that controls the concentration is arranged in the outlet line 12, a distance from a position where the concentration is controlled at a certain value to a position where the mixed gas is output to a downstream process is short, it is possible to output the mixed gas to the downstream process without almost any fluctuation of the concentration.

Furthermore, since the first valve 23 is arranged downstream of both the partial pressure measuring sensor 21 and the pressure sensor 22, it is possible for the partial pressure measuring sensor 21 and the pressure sensor 22 to measure the partial pressure or the total pressure of the system prior to being affected by the operation of the first valve 23. As a result, since the partial pressure or the total pressure in the tank 13 where the material gas actually evaporates can be measured with high accuracy, it is possible to control the first valve 23 responsive to changes of the evaporation rate of the material gas. Namely, it is possible to control the concentration of the material gas with high accuracy.

In addition, since the partial pressure measuring sensor 21, the pressure sensor 22 and the first valve 23 are mounted on the body B and the material gas concentration control system 2 is packaged in one unit, it is possible to control the concentration just by mounting the material gas concentration control system 2 on the outlet line 12. In other words, there is no need for a conventional procedure of arranging wiring in order to feed back the signal from the sensors mounted on the outlet line 12 to the inlet line 11, and it is possible to control the concentration with high accuracy.

Now, another embodiment will be explained. The same reference characters will be given to the components corresponding to the above-mentioned embodiment.

In the above-mentioned embodiment, the concentration of the material gas in the mixed gas is controlled by controlling the first valve 23 so as to make the total pressure of the mixed gas become the set pressure, however, the first valve 23 may be controlled with the concentration measured by the concentration measuring part CS used as the control variable.

In the above-mentioned embodiment, only the concentration of the material gas is controlled, however, in case of controlling also the flow, a mass flow controller may be arranged in the inlet line 11. The mass flow controller comprises a differential pressure type flow meter or a thermal type flow meter which constitute a flow measuring means to measure a volume flow or a mass flow of the carrier gas flowing into the inlet line 11, and a second valve to adjust the flow of the carrier gas by means of the open degree of the valve body, and each of which is arranged in this order from upstream, and may further comprise a mass flow controller control part to control the flow of the carrier gas.

The concentration measuring part CS calculates the concentration by the use of the partial pressure and the total pressure, however, the concentration may be directly measured by, for example, an ultrasonic concentration meter. In addition, the partial pressure measuring sensor 21 is not limited to the non-dispersive infrared (NDIR) method, and may be of the Fourier transform infrared (FTIR) spectroscopic method or the laser absorption spectroscopic (LAS) method.

The flow of the material gas may be controlled by the second valve 32 so as to lessen the deviation between the set flow and the calculated flow of the material gas calculated based on the measured concentration and the measured carrier gas flow.

A temperature sensor 25 (temperature measuring part) may be arranged in the material gas concentration control system 2 so as to compensate for a change of the measured result of the pressure or the partial pressure due to a temperature change. With this arrangement, it is possible to control the concentration with higher accuracy. In addition, a signal showing a deteriorated state of a light source may be obtained from the partial pressure measuring part. For example, the control part may have such an arrangement that a lifetime of the light source is grasped by means of a moment-to-moment change of a current the light source and displays a notice to indicate that the light source be replaced before a critical influence is exerted on the measurement result.

Either a position of the pressure sensor or a position of the partial pressure measuring sensor may be located at an upstream side. A direction of mounting the partial pressure measuring sensor is not limited to a vertical direction, and may be in a horizontal direction so as to mount on a side surface of the body B. In this case, it is possible to prevent accumulation on a window through which the light of the partial pressure measuring sensor passes of a component of the gas due to the gravity. In addition, it is also possible to prevent accumulation of liquid droplet due to dew condensation.

In addition, in order to make it possible to connect the material gas concentration control system of this invention with a gas panel or the like that is used for lessening an area where this system is installed, an inlet or an outlet of the internal flow channel is arranged to face vertically downward, or the inlet or the outlet may be changed to face vertically downward by the use of a joint to change the direction.

The present claimed invention may be variously modified without departing from the spirit of the invention.

EXPLANATION OF REFERENCE CHARACTERS

2 ... material gas concentration control system
1 ... bubbling system
11 ... inlet line
12 ... outlet line
13 ... tank
CS ... concentration measuring part
21 ... partial pressure measuring sensor
22 ... pressure measuring part
23 ... first valve
CC ... concentration control part
242 ... first valve control part
243 ... set pressure setting part
FS ... flow measuring part
FC ... flow control part
32 ... second valve
332 ... second valve control part
333 ... set carrier gas flow setting part

The invention claimed is:

1. A material gas concentration control system that is used for a material evaporation system comprising a tank to accommodate a material, an inlet line to input a carrier gas for evaporating the accommodated material into the tank and an outlet line to output a mixed gas consisting of a material gas formed of the evaporated material and the carrier gas from the tank, the material gas concentration control system comprising:

a body that is connected to the outlet line and that has an internal flow channel for flowing the mixed gas;

a concentration measuring sensor that measures the concentration of the material gas in the mixed gas flowing in the internal flow channel; and a first valve that is arranged downstream of the concentration measuring sensor and that adjusts the measured concentration measured by the concentration measuring sensor at a previously determined set concentration, wherein the concentration measuring sensor and the first valve are mounted on the body;

the concentration measuring sensor and the first valve are arranged from the concentration measuring sensor to the first valve along the flow of the mixed gas flowing in the internal flow channel;

the body has a connecting port that is configured to connect the outlet line and the internal flow channel;

the concentration measuring sensor is arranged between the connecting port and the first valve.

2. The material gas concentration control system described in claim 1, wherein the concentration measuring sensor comprises:

a partial pressure measuring sensor that measures a partial pressure of the material gas, and a pressure measuring sensor that measures a pressure of the mixed gas, wherein the concentration of the material gas in the mixed gas is measured based on the measured partial pressure measured by the partial pressure measuring sensor and the measured pressure measured by the pressure measuring sensor.

3. The material gas concentration control system described in claim 2, further comprising:

a temperature measuring sensor for measuring a temperature of the mixed gas flowing in the internal flow channel.

4. The material gas concentration control system described in claim 2, wherein a surface of the internal flow channel is provided with a mirror finish.

5. The material gas concentration control system described in claim 4, further comprising:

a temperature measuring sensor for measuring a temperature of the mixed gas flowing in the internal flow channel.

6. The material gas concentration control system described in claim 2, wherein:

both the partial pressure measuring sensor and the pressure measuring sensor are mounted on the body.

7. The material gas concentration control system described in claim 1, further comprising:

a temperature measuring sensor for measuring a temperature of the mixed gas flowing in the internal flow channel.

8. The material gas concentration control system described in claim 1, wherein:

the concentration measuring sensor is an ultrasonic concentration meter.

9. The material gas concentration control system described in claim 1, wherein:

the concentration measuring sensor has multiple sensors, and all of the multiple sensors are mounted on the body.

10. The material gas concentration control system described in claim 1, wherein:

the body has one or multiple mounting surfaces that the concentration measuring sensor or the first valve is configured to be mounted, and at least a part of the concentration measuring sensor and the first valve are mounted on the same mounting surface.

11. The material gas concentration control system described in claim 1, wherein a surface of the internal flow channel is provided with a mirror finish.

* * * * *